United States Patent
Chang (10) Patent No.: US 7,897,959 B2
(45) Date of Patent: Mar. 1, 2011

(54) PHASE CHANGE MEMORY DEVICE HAVING A WORD LINE CONTACT

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 201 days.

(21) Appl. No.: 12/173,335

(22) Filed: Jul. 15, 2008

(65) Prior Publication Data

US 2009/0302299 A1 Dec. 10, 2009

(30) Foreign Application Priority Data

Jun. 5, 2008 (KR) .................. 10-2008-0052887

(51) Int. Cl.
*H01L 47/00* (2006.01)
(52) U.S. Cl. ... 257/4; 257/2; 257/3; 257/5; 257/E45.002; 438/622; 438/637; 438/672
(58) Field of Classification Search .................. 257/2–5; 438/622, 700, 637–638, 672–673
See application file for complete search history.

(56) References Cited

U.S. PATENT DOCUMENTS
2006/0024950 A1* 2/2006 Choi et al. .................. 438/626

FOREIGN PATENT DOCUMENTS
| KR | 1020010090154 A | 10/2001 |
| KR | 1020040077156 A | 9/2004 |
| KR | 10-0705949 B1 | 4/2007 |
| KR | 1020080011791 A | 2/2008 |

* cited by examiner

*Primary Examiner* — Dung A. Le
(74) *Attorney, Agent, or Firm* — Ladas & Parry LLP

(57) ABSTRACT

A phase change memory device having a word line contact includes an N+ base layer formed in a surface of a semiconductor substrate. A word line is formed over the N+ base layer. The word line contact is formed to connect the N+ base layer to the word line. The word line contact includes a first contact plug, a barrier layer formed on the first contact plug, and a second contact plug formed on the barrier layer coaxially with the first contact plug. The barrier layer prevents unwanted etching of the first contact plug when the second contact plug is being formed.

8 Claims, 5 Drawing Sheets

PHASE CHANGE MEMORY DEVICE HAVING A WORD LINE CONTACT

CROSS-REFERENCE TO RELATED APPLICATIONS

The present application claims priority to Korean patent application number 10-2008-0052887 filed on Jun. 5, 2008, which is incorporated herein by reference in its entirety.

BACKGROUND OF THE INVENTION

The present invention relates generally to a phase change memory device and a method for manufacturing the same, and more particularly, to a phase change memory device in which a word line contact for connecting a word line to an N+ base layer can be stably formed and a method for manufacturing the same.

Memory devices are typically grouped into volatile random access memory (RAM), in which data is lost when power is interrupted, and non-volatile read-only memory (ROM), in which stored data is maintained even when power is interrupted. Examples of volatile RAM include dynamic RAM (DRAM) and static RAM (SRAM), and examples of non-volatile ROM include flash memory devices such as electrically erasable and programmable ROM (EEPROM).

DRAM is considered an excellent memory device and has many desirable characteristics. However, DRAM must have high charge storing capacity. In order to obtain a high charge storing capacity, the surface area of certain electrodes in the DRAM must be increased; however, if the surface area of the electrodes is increased it is difficult to achieve a high level of integration. Further, in a flash memory device two gates are stacked on each other, and thus a high operation voltage relative to a power supply voltage is required. Therefore, a separate booster circuit is necessary in order to generate the voltage necessary for write and delete operations, which in turn makes it difficult to achieve a high level of integration.

With these constraints in mind, efforts have been made to develop a memory device having a simple configuration and capable of accomplishing a high level of integration while retaining the desirable characteristics of a non-volatile memory device. Recently, phase change memory devices have been gaining popularity. In a phase change memory device, a phase change (crystalline state to amorphous state) occurs in a phase change layer interposed between a bottom electrode and a top electrode when a current is applied to and flows between the bottom electrode and the top electrode. The amorphous and crystalline states have different resistances, and using this phenomenon information stored in a cell can be recognized using the medium of the resistances of the crystalline state and the amorphous state.

An extremely important factor that must be considered when developing a highly integrated phase change memory device is the reduction of programming current. To reduce programming current, a vertical PN diode is used as a cell switching element.

Figure 1:
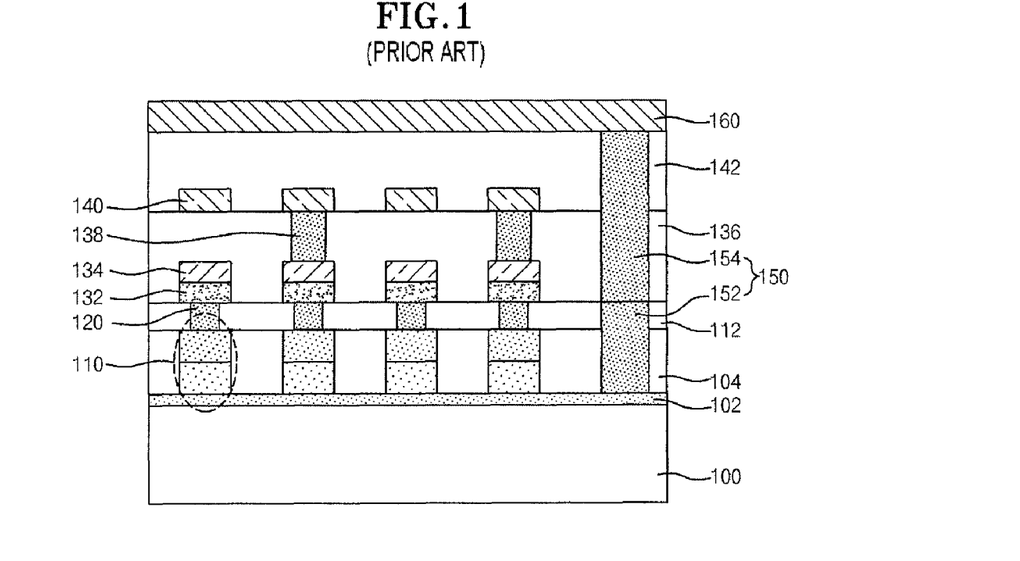
FIG. 1 is a cross-sectional view showing a conventional phase change memory device.

FIG. 1 is a cross-sectional view showing a conventional phase change memory device in which a vertical PN diode is used as a cell switching element. The conventional phase change memory device will be described below.

Referring to FIG. 1, cell switching elements 110 comprising vertical PN diodes are formed on a semiconductor substrate 100. In order to electrically connect the cell switching elements 110 to a word line 160, an N+ base layer 102 is formed in the surface of the semiconductor substrate 100. In order to connect the word line 160 to the N+ base layer 102, a word line contact 150 is formed.

The vertical PN diodes constituting the cell switching elements 110 are composed of stack patterns of an N-type silicon layer and a P-type silicon layer. The word line contact 150 is composed of a first contact plug 152 and a second contact plug 154 which are coaxially connected to each other. In the word line contact 150, after the first contact plug 152 is formed, the second contact plug 154 is formed on the first contact plug 152.

A heater 120 (which serves also as bottom electrode) is formed on each of the cell switching elements 110 comprising the vertical PN diodes, and a stack pattern of a phase change layer 132 and a top electrode 134 are formed on each of the heaters 120. Bit lines 140 are formed over the top electrodes 134 and extend in a direction perpendicular to the word line 160. The bit lines 160 are connected to the top electrodes 134 via top electrode contacts 138.

When compared to a phase change memory device having CMOS transistors as cell switching elements, the phase change memory device having the vertical PN diodes as the cell switching elements 110 has an advantage, in that current flow is high and thus programming current can be reduced. Therefore, the size of cells in the phase change memory can be decreased relative to DRAM or a flash memory device.

In FIG. 1, reference numeral 104 designates a first insulation layer, 112 a second insulation layer, 136 a third insulation layer, and 142 a fourth insulation layer.

However, the above-described conventional phase change memory device is not without problems as is described below.

The first and second contact plugs 152 and 154 of the word line contact 150 that are used to connect the word line 160 to the N+ base layer 102 are formed by depositing tungsten (W) to fill first and second contact holes and then etching back the W. In the course of filling the first and second contact holes with W, seams are likely to be generated in the contact holes. Etching conducted during the etch-back process may then expose the seams to the outside. As a result, when the second contact hole for forming the second contact plug 154 is defined and the first contact plug 152 is etched, a problem occurs in that the contact resistance between the word line 160 and the N+ base layer 102 becomes non-uniform. Specifically, when etch loss of the first contact plug 152 is substantial, the N+ base layer 102 may also be etched causing damage to the N+ base layer 102, and thus the reliability of the phase change memory device can be seriously deteriorated.

The etch loss of the first contact plug 152 and damage to the N+ base layer 102 can be reduced by decreasing the degree of the etch-back; however, in this case, the first contact plugs 152 are not properly separated from each other, whereby a short-circuit can be formed. Therefore, the technique of decreasing the degree to which W is etched back in order to suppress or prevent the etch loss of the first contact plug 152 cannot be adopted.

SUMMARY OF THE INVENTION

Embodiments of the present invention are directed to a phase change memory device in which a word line contact for connecting a word line to an N+ base layer can be formed in a stable manner and a method for manufacturing the same.

Additionally, embodiments of the present invention are directed to a phase change memory device in which a word line contact is formed in a stable manner allowing for uniform contact resistance between a word line and an N+ base layer, and a method for manufacturing the same.

Further, embodiments of the present invention are directed to a phase change memory device in which the contact resistance between a word line and an N+ base layer is uniform, thereby ensuring a stable current flow between a cell switching element and the word line, and a method for manufacturing the same.

In one embodiment, a phase change memory device comprises an N+ base layer formed in a surface of a semiconductor substrate; a word line formed over the N+ base layer; and a word line contact formed to connect the N+ base layer to the word line and comprising a first contact plug, a barrier layer which is formed on the first contact plug, and a second contact plug which is formed on the barrier layer coaxially with the first contact plug.

Each of the first and second contact plugs comprises a diffusion barrier and a contact hole filling conductive layer.

The diffusion barrier is formed of at least one of Ti and TiN.

The contact hole filling conductive layer is formed of any one of Si, W, Al, and Cu.

The barrier layer is formed of any one of TiN, WN and TiAlN.

In another embodiment, a phase change memory device comprises a semiconductor substrate having an N+ base layer formed in a surface thereof; a first insulation layer formed on the semiconductor substrate including the N+ base layer; cell switching elements formed in the first insulation layer and comprising vertical PN diodes; a second insulation layer formed on the first insulation layer to cover the cell switching elements; heaters formed in the second insulation layer to come into contact with the cell switching elements; a first contact plug formed through the first and second insulation layers to come into contact with the N+ base layer and the first contact plug having a recess; a barrier layer formed in the recess of the first contact plug; a phase change layer and top electrodes formed on the second insulation layer including the heaters; a third insulation layer formed on the second insulation layer to cover the top electrodes and the first contact plug including the barrier layer; bit lines formed on the third insulation layer to come into contact with the top electrodes; a fourth insulation layer formed on the third insulation layer to cover the bit lines; a second contact plug formed through the third and fourth insulation layers coaxially with the first contact plug, with the first contact plug and the second contact plug constituting a word line contact; and a word line formed on the fourth insulation layer to be connected to the N+ base layer via the word line contact.

The first contact plug comprises a first contact hole defined in the first and second insulation layers and exposing the N+ base layer; a first diffusion barrier formed on a surface of the first contact hole (excluding an upper end portion of the first contact hole); and a first contact hole filling conductive layer formed on the first diffusion barrier to fill the first contact hole and having a recess.

The first diffusion barrier is formed of at least one of Ti and TiN.

The first contact hole filling conductive layer is formed of any one of Si, W, Al and Cu.

The barrier layer is formed of any one of TiN, WN and TiAlN.

The second contact plug comprises a second contact hole defined through the third and fourth insulation layers and exposing the barrier layer; a second diffusion barrier formed on a surface of the second contact hole; and a second contact hole filling conductive layer formed on the second diffusion barrier to fill the second contact hole.

The second diffusion barrier is formed of at least one of Ti and TiN.

The second contact hole filling conductive layer is formed of any one of Si, W, Al and Cu.

In another embodiment, a method for manufacturing a phase change memory device comprises the step of forming a word line contact for connecting an N+ base layer to a word line, the step of forming the word line contact comprises forming a first contact plug; recessing an upper end portion of the first contact plug; forming a barrier layer in a recess of the first contact plug; and forming a second contact plug on the barrier layer coaxially with the first contact plug.

Each of the first and second contact plugs is formed to include a diffusion barrier and a contact hole filling conductive layer.

The diffusion barrier is formed of at least one of Ti and TiN.

The contact hole filling conductive layer is formed of any one of Si, W, Al, and Cu.

The barrier layer is formed of any one of TiN, WN and TiAlN.

In yet another embodiment, a method for manufacturing a phase change memory device comprises the steps of forming an N+ base layer in the surface of a semiconductor substrate; forming a first insulation layer on the semiconductor substrate including the N+ base layer; forming cell switching elements comprising vertical PN diodes in the first insulation layer; forming a second insulation layer on the first insulation layer to cover the cell switching elements; forming heaters in the second insulation layer to come into contact with the cell switching elements; forming a first contact plug through the first and second insulation layers to come into contact with the N+ base layer and to have a recess; forming a barrier layer in the recess of the first contact plug; forming a phase change layer and top electrodes on the second insulation layer including the heaters; forming a third insulation layer on the second insulation layer to cover the top electrodes and the barrier layer; forming bit lines on the third insulation layer to come into contact with the top electrodes; forming a fourth insulation layer on the third insulation layer to cover the bit lines; forming a second contact plug through the third and fourth insulation layers coaxially with the first contact plug, with the first contact plug and the second contact plug forming a word line contact; and forming a word line on the fourth insulation layer to be connected to the N+ base layer via the word line contact.

The step of forming the first contact plug comprises the steps of etching the first and second insulation layers and thereby defining a first contact hole to expose the N+ base layer; forming a first diffusion barrier on a surface of the first contact hole and the second insulation layer; forming a first contact hole filling conductive layer on the first diffusion barrier to fill the first contact hole; removing the first contact hole filling conductive layer and the first diffusion barrier until the second insulation layer is exposed; and recessing the first contact hole filling conductive layer and the first diffusion barrier.

The first diffusion barrier is formed of at least one of Ti and TiN.

The first contact hole filling conductive layer is formed of any one of Si, W, Al, and Cu.

The step of removing the first contact hole filling conductive layer and the first diffusion barrier until the second insulation layer is exposed is implemented through a CMP process.

The barrier layer is formed of any one of TiN, WN and TiAlN.

The step of forming the second contact plug comprises the steps of etching the third and fourth insulation layers and thereby defining a second contact hole to expose the barrier layer; forming a second diffusion barrier on a surface of the second contact hole and the fourth insulation layer; forming a second contact hole filling conductive layer on the second diffusion barrier to fill the second contact hole; and removing the second contact hole filling conductive layer and the second diffusion barrier until the fourth insulation layer is exposed.

The second diffusion barrier is formed of at least one of Ti and TiN.

The second contact hole filling conductive layer is formed of any one of Si, W, Al, and Cu.

The step of removing the second contact hole filling conductive layer and the second diffusion barrier until the fourth insulation layer is exposed is implemented through a CMP process.

DESCRIPTION OF SPECIFIC EMBODIMENTS

Hereafter, specific embodiments of the present invention will be described with reference to the attached drawings.

Figure 2:
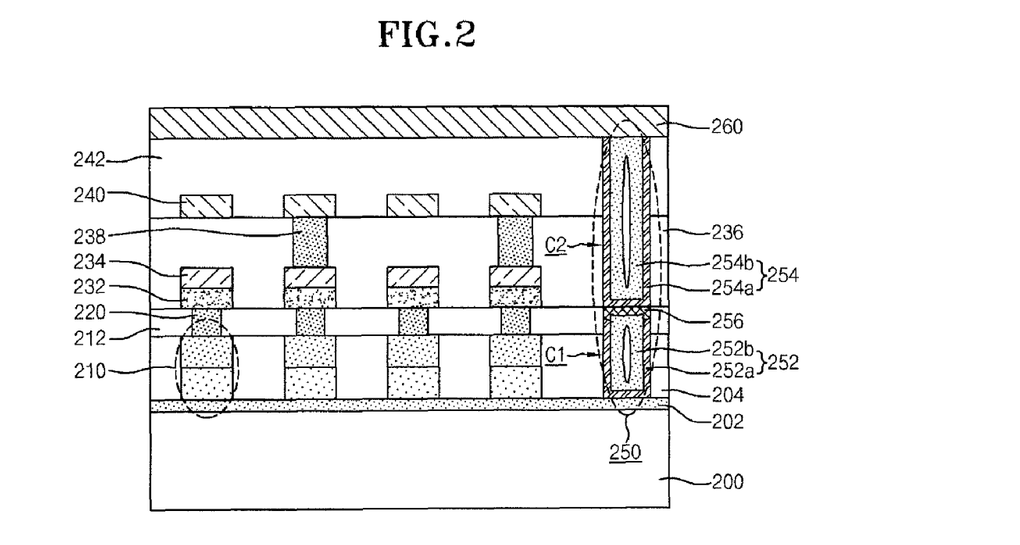
FIG. 2 is a cross-sectional view showing a phase change memory device according to an embodiment of the present invention.

FIG. 2 is a cross-sectional view showing a phase change memory device according to an embodiment of the present invention.

Referring to FIG. 2, a plurality of cell switching elements 210 comprising vertical PN diodes are formed on a semiconductor substrate 200. The semiconductor substrate 200 includes a plurality of bar-type active regions extending in a first direction and separated from each other by regular intervals extending in a second direction perpendicular to the first direction. Each of the cell switching elements 210 comprises a stack pattern of an N-type silicon layer and a P-type silicon layer to form a vertical PN diode. A predetermined number of cell switching elements 210 comprising the vertical PN diodes (for example, a multiple of 2) constitute one string.

An N+ base layer 202 is formed in a surface of the semiconductor substrate 200 in order to connect the cell switching elements 210 comprising the vertical PN diodes to a word line 260. The N+ base layer 202 is positioned between adjacent strings of cell switching elements 210. The N+ base layer 202 is formed by ion-implanting P or As at a doping concentration in the range of $1 \times 10^{20} \sim 1 \times 10^{22}$ ions/cm$^3$.

A word line contact 250 is extends through insulation layers 204, 212, 236, and 242 to electrically connect the N+ base layer 202 to the word line 260, which are located on different planes. The word line contact 250 includes a first contact plug 252 extending through the first and second insulation layers 204 and 212, a second contact plug 254 formed coaxially to the first contact plug 252 and extending through the third and fourth insulation layers 236 and 242, and a barrier layer 256 interposed between the first contact plug 252 and the second contact plug 254. The word line contact 250 contacts a portion of the N+ base layer 202 (which is positioned between adjacent strings each comprising the predetermined number of cell switching elements 210).

The first and second contact plugs 252 and 254 include diffusion barriers 252a and 254a formed on surfaces of respective contact holes C1 and C2 and conductive layers 252b and 254b formed on the diffusion barriers 252a and 254a to fill the contact holes C1 and C2. In more detail, the upper end of the first contact plug 252 is recessed, and the barrier layer 256 is formed in the recess defined in the first contact plug 252. The material used to form the conductive layers 252b and 254b may be any one of Si, W, Al, and Cu; and preferably, W is the material used to form the conductive layers 252b and 254b. As shown in FIG. 2, in the course of depositing W, seams are generated in the first and second contact plugs 252 and 254. The material used to form the barrier layer 256 may be any one of TiN, WN, and TiAlN.

In succession, a heater 220 (serving also as a bottom electrode) is formed on each of the cell switching elements 210, and stack patterns comprising a phase change layer 232 and a top electrode 234 are formed on portions of the second insulation layer 212 corresponding to the heaters 220 (that is, a stack pattern is formed on each of the heaters and a portion of the second insulation layer 212 corresponding to the heater). Top electrode contacts 238 are formed in the third insulation layer 236 to come into contact with top electrodes 234, and bit lines 240 are formed on the third insulation layer 236 such that the bit lines 240 are electrically connected to the top electrodes 234 through the top electrode contacts 238 to apply optional electrical signals to the top electrodes 234. The word line 260 is formed on the fourth insulation layer 242 over the bit lines 240. The word line 260 extends in the direction perpendicular to the bit lines 240. As described above, the word line 260 is electrically connected to the N+ base layer 202 through the word line contact 250.

In the phase change memory device according to the present embodiment, constructed as described above, the word line contact for connecting the word line to the N+ base layer is composed of the first contact plug and the second contact plug, which share a common axis, and the barrier layer is interposed between the first contact plug and the second contact plug. The presence of the barrier layer solves the problems caused by the loss of the first contact plug and the damage to the N+ base layer when the second contact plug is formed.

Accordingly, in the phase change memory device according to the present embodiment, the formation of the word line contact (which is composed of the first contact plug and the second contact plug coaxially connected with each other) can be implemented in a stable manner. Therefore, the a uniform contact resistance between the word line and the N+ base layer can be realized, and thereby, the current flow from the cell switching elements to the word line can be stabilized. As such, the present embodiment results in an improvement in the operational characteristics and the reliability of the phase change memory device.

FIGS. 3A through 3H are cross-sectional views shown for illustrating the process steps in a method for manufacturing a phase change memory device in accordance with another embodiment of the present invention. The method will be described below.

Figure 3A:
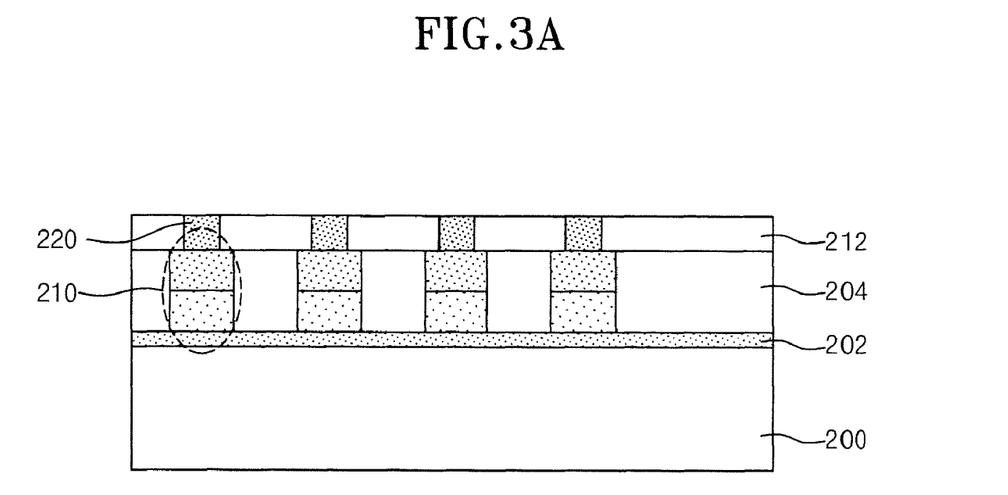
FIGS. 3A through 3H are cross-sectional views shown for illustrating the process steps in a method for manufacturing a phase change memory device according to an embodiment of the present invention.

Referring to FIG. 3A, the semiconductor substrate 200 includes a plurality of bar-type active regions. Ion-implantation of N-type impurities (e.g. P or As) is performed to form an N+ base layer 202 in the surfaces of the bar-type active regions in the semiconductor substrate 200. The N+ base layer 202 is formed by ion-implanting the N-type impurities (such as P or As) at a doping concentration in the range of $1 \times 10^{20} \sim 1 \times 10^{22}$ ions/cm$^3$. Then, a first insulation layer 204 is formed on the semiconductor substrate 200 including the N+ base layer 202.

The first insulation layer 204 is etched to define holes for forming vertical PN diodes which constitute cell switching elements. Then, an N-type silicon layer is formed in respective holes using a selective epitaxial growth (SEG) process. P-type impurities are implanted in the N-type silicon layer using ion-implantations to form a P-type silicon layer on the N-type silicon layer. Through this process, cell switching elements 210 comprising vertical PN diodes (which have the stack structure of the N-type silicon layer and the P-type silicon layer) are formed. A predetermined number (e.g., a multiple of 2) of the cell switching elements 210 constitutes one string.

A second insulation layer 212 is then formed on the first insulation layer 204 in which the plurality of cell switching elements 210 were formed. Heaters 220 are then formed in the second insulation layer 212. The heaters 220, which also serve as bottom electrodes, are formed such that they contact the cell switching elements 210.

Figure 3B:
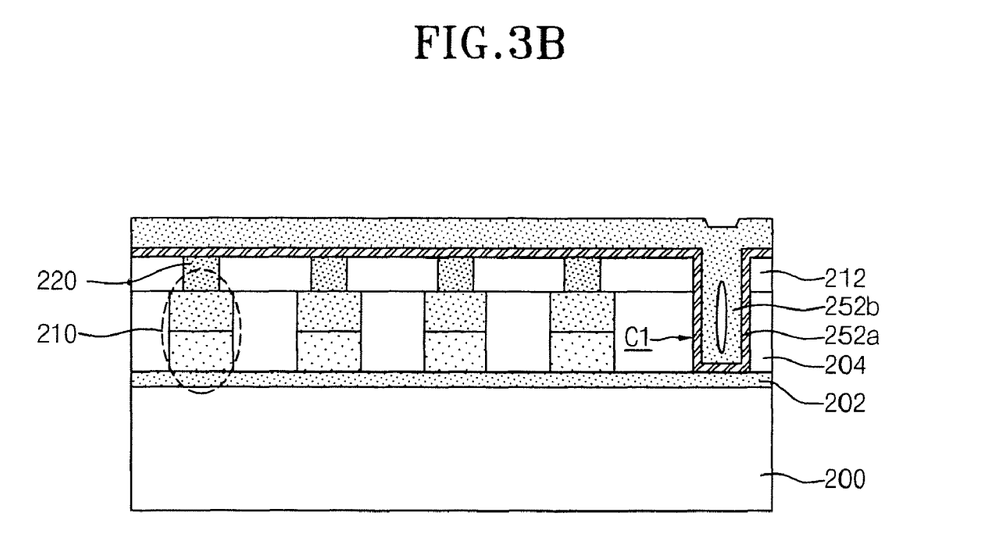

Referring to FIG. 3B, in the resultant substrate having the heaters 220 formed thereon, the second insulation layer 212 and the first insulation layer 204 are etched to define a first contact hole C1 exposing the N+ base layer 202. It is preferred that the first contact hole C1 be defined on a portion of the N+ base layer 202 positioned between adjacent strings each comprising a predetermined number of cell switching elements 210. A first diffusion barrier 252a is formed on the second insulation layer 212 including the surface of the first contact hole C1. The first diffusion barrier 252a is formed of at least one of Ti and TiN. A first conductive layer 252b is then formed on the first diffusion barrier 252a including the surface of the first diffusion barrier 252a to fill the first contact hole C1. The first conductive layer 252b may be formed of any one of Si, W, Al, and Cu; and the first conductive layer 252b is preferably formed of W. When forming the first conductive layer 252b, because the first contact hole C1 has a substantial aspect ratio, seams are likely to be generated as is illustrated in FIG. 3B.

Preferably, before forming the first diffusion barrier 252a, a metal silicide layer (not shown) is formed on the portion of the N+ base layer 202 exposed by the first contact hole C1.

Figure 3C:
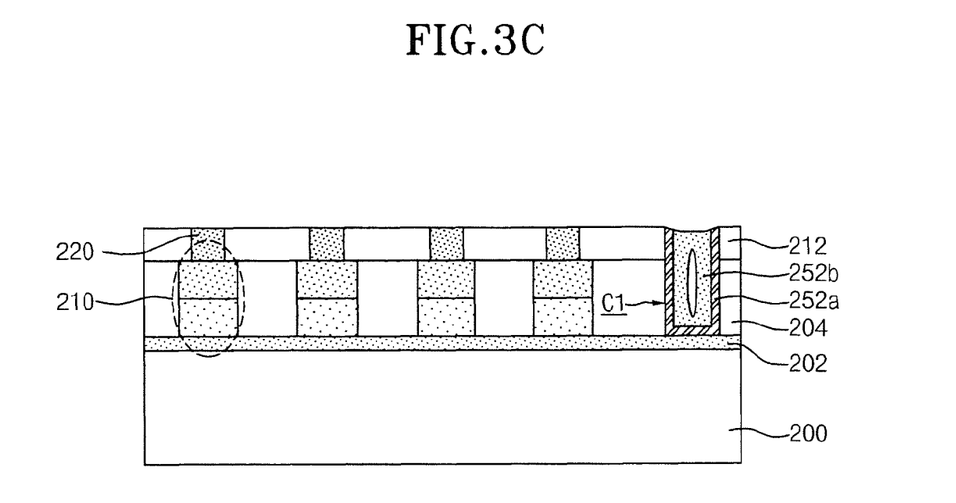

Referring to FIG. 3C, the first conductive layer 252b and the first diffusion barrier 252a are removed using a chemical mechanical polishing (CMP) process until the second insulation layer 212 is exposed.

Figure 3D:
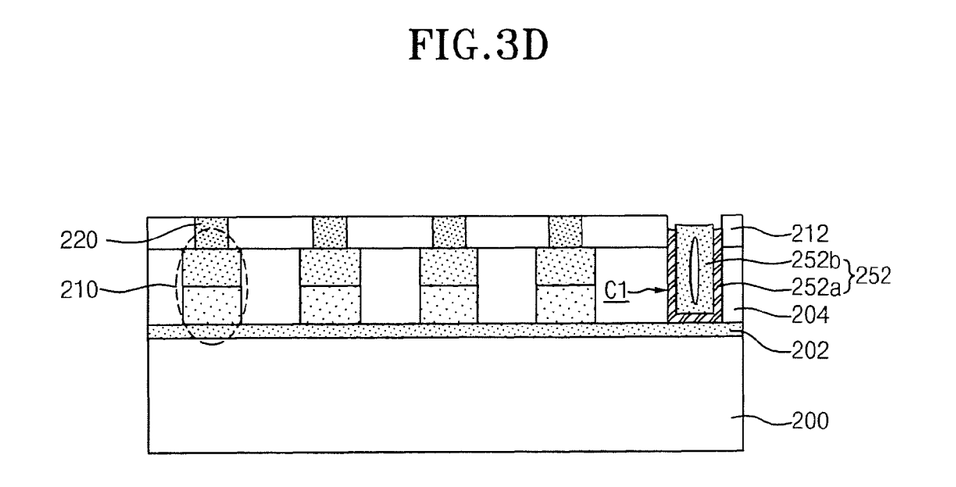

Referring to FIG. 3D, a portion of the first diffusion barrier 252a, which is formed at the upper end of the first contact hole C1, is removed using a selective etching process. At this time, portion of the upper end of the first conductive layer 252b filled in the first contact hole C1 is also etched, and the result is the formation of the recessed first contact plug 252.

Figure 3E:
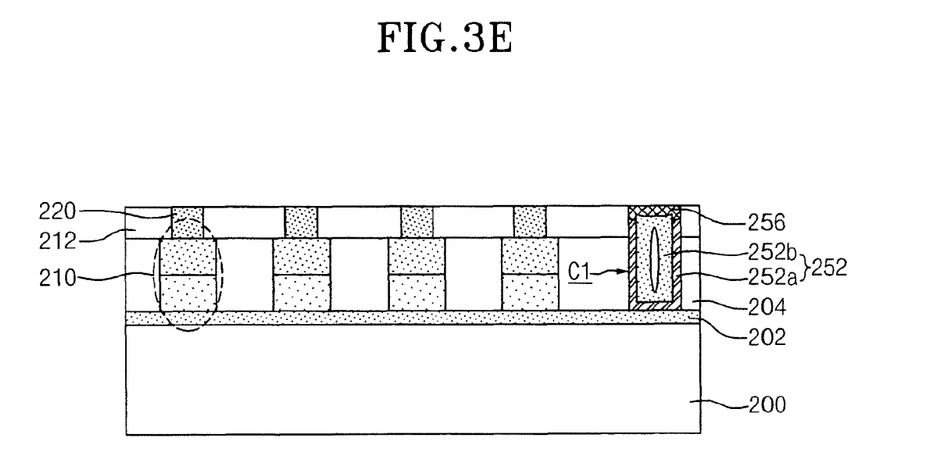

Referring to FIG. 3E, a barrier layer 256 is deposited on the second insulation layer 212 to fill the recess created in the first contact plug 252, that is, the upper end of the first contact hole C1. Then, the barrier layer 256 is removed using a CMP process until the second insulation layer 212 is exposed. As a result, the barrier layer 256 is formed only in the recess of the first contact plug 252. The barrier layer 256 functions to prevent etch loss of the first contact plug 252 when the second contact plug is formed during a subsequent process.

Figure 3F:
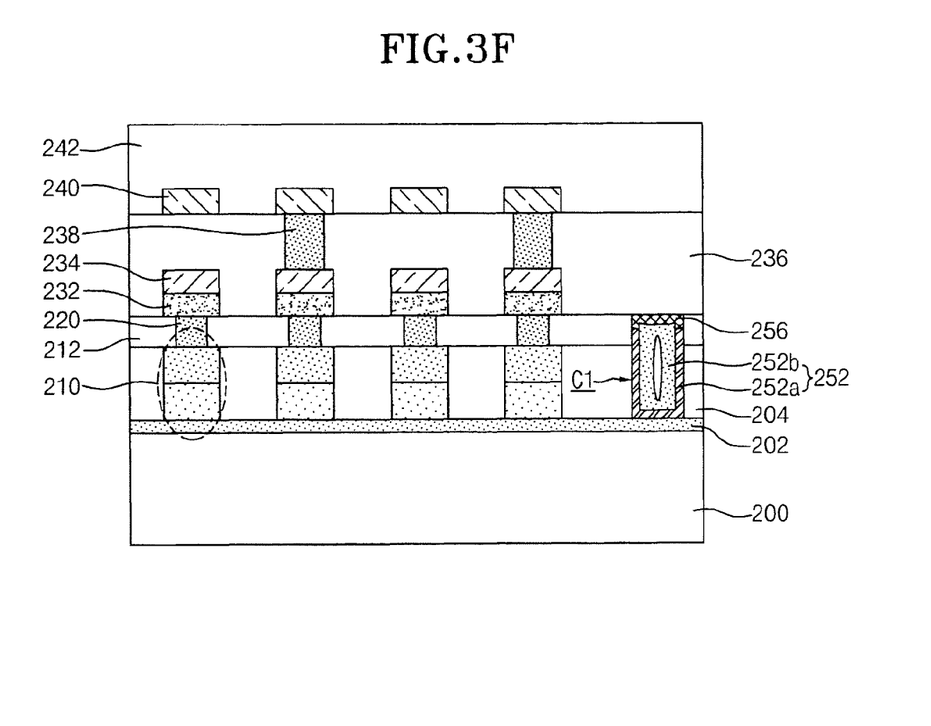

Referring to FIG. 3F, a phase change material layer and a conductive layer for top electrodes are sequentially deposited on the second insulation layer 212 of the resultant substrate. The conductive layer for top electrodes and the phase change material layer are then patterned to form stack patterns comprising a phase change layer 232 and a top electrode 234 on the heaters 200 and the portions of the second insulation layer 212 corresponding to the heaters 220. A third insulation layer 236 is then formed on the second insulation layer 212 to cover the stack patterns (which include the phase change layer 232 and the top electrode 234) and the barrier layer 256.

The third insulation layer 236 is then etched to define opening which expose the top electrodes 234. A conductive layer is then filled in the openings and top electrode contacts 238 are formed. The top electrode contacts 238 contact the top electrodes 234. Then, a metal layer for bit lines is deposited on the third insulation layer 236 including the top electrode contacts 238. The metal layer is patterned to form a plurality of bit lines 240 on the third insulation layer 236 each of which contacts a respective top electrode contact 238 and extends in a direction perpendicular to the active regions. Thereafter, a fourth insulation layer 242 is formed on the third insulation layer 236 including the bit lines 240.

Figure 3G:
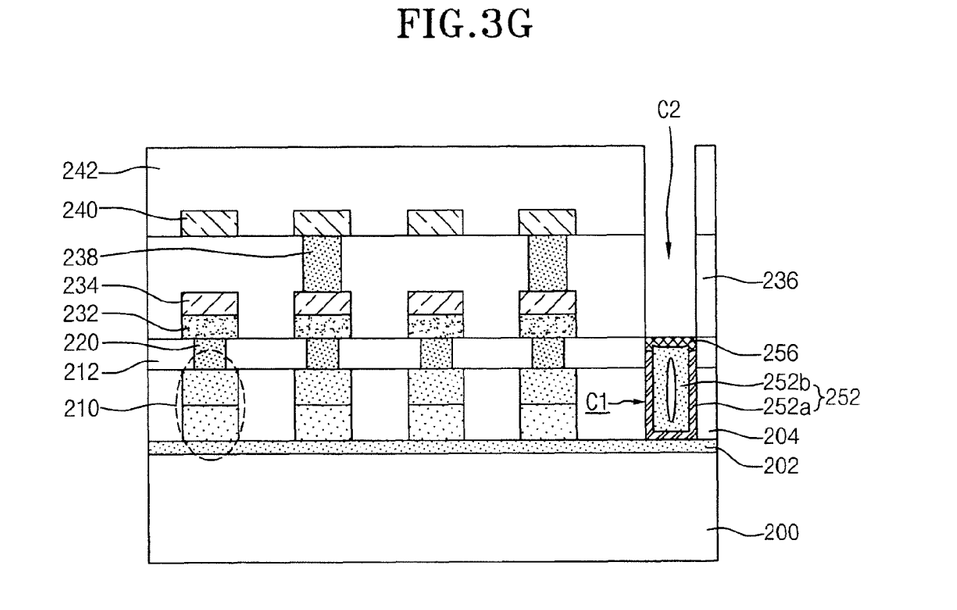

Referring to FIG. 3G, the fourth insulation layer 242 and the third insulation layer 236 are etched to define a second contact hole C2 that exposes the barrier layer 256 which is formed in the recess of the first contact plug 252. At this time, since the barrier layer 256 is present on the first contact plug 252, etch loss of the first contact plug 252 is prevented by the barrier layer 256 when defining the second contact hole C2.

Figure 3H:
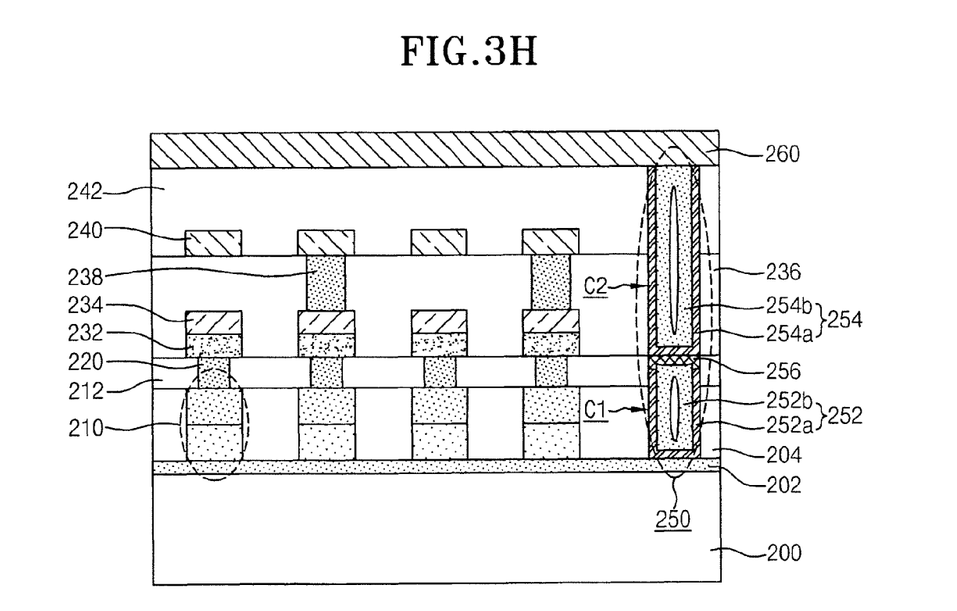

Referring to FIG. 3H, a second diffusion barrier 254a is deposited on the surface of the second contact hole C2 and on the fourth insulation layer 242 using any one of Ti and TiN. A second conductive layer 254b is then deposited on the second diffusion barrier 254a using any one of Si, W, Al and Cu; and preferably using W. Then, the second conductive layer 254b and the second diffusion barrier 254a are removed using a CMP process until the fourth insulation layer 242 is exposed. Through this, a second contact plug 254 is formed such that the second contact plug 254 is coaxially connected with the first contact plug 252 including the barrier layer 256. As a result, a word line contact 250, which is electrically connected to the N+ base layer 202, is formed.

In the word line contact 250 according to the present invention (which comprises the first contact plug 252 and the second contact plug 254 coaxially connected to each other) a barrier layer 256 is formed on the first contact plug 252; and therefore, when forming the second contact plug 254, etch loss in the first contact plug 252 can be prevented and the formation of the word line contact 250 can be implemented in a stable manner.

A conductive layer for word lines is deposited on the fourth insulation layer 242 including the second contact plug 254. The conductive layer is then patterned to form a word line 260 which is electrically connected to the N+ base layer 202 through the word line contact 250 comprising the first and second contact plugs 252 and 254.

Thereafter, while not shown in the drawings, by sequentially conducting a series of well-known subsequent processes, the manufacture of a phase change memory device according to the present embodiment is completed.

As is apparent from the above description, in the present invention, the formation of the word line contact 250, which comprises the first and second contact plugs 252 and 254 coaxially connected to each other, can be implemented in a stable manner. Therefore, a uniform contact resistance between the word line 260 and the N+ base layer 202 can be realized, and thereby, the current flow from the cell switching elements 210 to the word line 260 can be stabilized.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A phase change memory device having a semiconductor substrate with an N+ base layer formed in a surface thereof, the phase change memory device comprising:
   a first insulation layer formed on the semiconductor substrate including the N+ base layer;
   a cell switching element formed in the first insulation layer and comprising a vertical PN diode;
   a second insulation layer formed on the first insulation layer to cover the cell switching element;
   a heater formed in the second insulation layer and contacting the cell switching element;
   a first contact plug extending through the first and second insulation layers and contacting the N+ base layer, wherein the first contact plug has a recess formed in an upper end portion thereof;
   a barrier layer formed in the recess of the first contact plug;
   a stack structure comprising a phase change layer and a top electrode formed on a portion of the second insulation layer and the heater;
   a third insulation layer formed on the second insulation layer to cover the top electrode, the phase change layer, and the barrier layer of the first contact plug;
   a bit line formed on the third insulation layer and contacting the top electrode;
   a fourth insulation layer formed on the third insulation layer to cover the bit line;
   a second contact plug extending through the third and fourth insulation layers and sharing a common axis with the first contact plug, wherein the first contact plug and the second contact plug form a word line contact; and
   a word line formed on the fourth insulation layer, wherein the word line contact electrically connects the word line to the N+ base layer.

2. The phase change memory device according to claim 1, wherein the first contact plug is formed in a first contact hole extending through the first and second insulation layers and exposing the N+ base layer, wherein the first contact plug comprises:
   a first diffusion barrier formed on a surface of the first contact hole excluding an upper end portion of the first contact hole; and
   a first contact hole filling conductive layer formed on the first diffusion barrier to fill the first contact hole, wherein the recess is formed in the upper end portion of the conductive layer.

3. The phase change memory device according to claim 2, wherein the first diffusion barrier comprises at least one of Ti and TiN.

4. The phase change memory device according to claim 2, wherein the first contact hole filling conductive layer comprises any one of Si, W, Al, and Cu.

5. The phase change memory device according to claim 1, wherein the barrier layer comprises any one of TiN, WN and TiAlN.

6. The phase change memory device according to claim 1, wherein the second contact plug is formed in a second contact hole extending through the third and fourth insulation layers and exposing the barrier layer, wherein the second contact plug comprises:
   a second diffusion barrier formed on a surface of the second contact hole; and
   a second contact hole filling conductive layer formed on the second diffusion barrier to fill the second contact hole.

7. The phase change memory device according to claim 6, wherein the second diffusion barrier comprises at least one of Ti and TiN.

8. The phase change memory device according to claim 6, wherein the second contact hole filling conductive layer comprises any one of Si, W, Al and Cu.

* * * * *